(12) United States Patent
Nagai

(10) Patent No.: US 8,389,985 B2
(45) Date of Patent: Mar. 5, 2013

(54) COLOR CONVERSION FILM CONTAINING A CONJUGATED HIGH MOLECULAR WEIGHT COPOLYMER AND MULTICOLOR LIGHT-EMITTING ORGANIC EL DEVICE INCLUDING THE SAME

(75) Inventor: Masaru Nagai, Nagano (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/992,529

(22) PCT Filed: Jun. 10, 2009

(86) PCT No.: PCT/JP2009/060585
§ 371 (c)(1),
(2), (4) Date: Sep. 26, 2011

(87) PCT Pub. No.: WO2010/143276
PCT Pub. Date: Dec. 16, 2010

(65) Prior Publication Data
US 2012/0068163 A1    Mar. 22, 2012

(51) Int. Cl.
*H01L 29/08* (2006.01)
(52) U.S. Cl. ............ 257/40; 257/E51.022; 524/612; 528/205; 368/241; 428/690; 428/917
(58) Field of Classification Search ............ 257/40, 257/E51.022; 524/612; 528/205; 368/241; 428/690, 917
See application file for complete search history.

(56) References Cited

U.S. PATENT DOCUMENTS

| | | |
|---|---|---|
| 5,683,823 A | 11/1997 | Shi et al. |
| 2008/0233429 A1 | 9/2008 | Oguma et al. |

FOREIGN PATENT DOCUMENTS

| | | |
|---|---|---|
| JP | 2000-026852 A | 1/2000 |
| JP | 2000-230172 A | 8/2000 |
| JP | 2000-243563 A | 9/2000 |
| JP | 2002-075643 A | 3/2002 |
| JP | 2003-013056 A | 1/2003 |
| JP | 2003-217859 A | 7/2003 |
| JP | 2004-362910 A | 12/2004 |

(Continued)

OTHER PUBLICATIONS

Matsuo et al., Adv. Funct. Mater. 2009, 19, 2224-2229.*

(Continued)

*Primary Examiner* — Shane Fang
(74) *Attorney, Agent, or Firm* — Rabin & Berdo, P.C.

(57) ABSTRACT

Provided are a color conversion film that maintains sufficient converted light intensity over a long period of time without increasing its thickness and a multicolor light-emitting organic EL device that includes the color conversion film. The color conversion film contains a conjugated high molecular weight copolymer having a structure of formula (1) that has alternating fluorene group-containing repeating units and arylenevinylene repeating units, and has phenylene groups inserted as spacers on both ends of the fluorene groups (1)

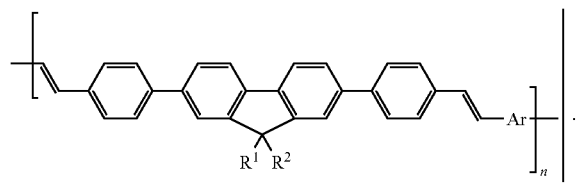

6 Claims, 3 Drawing Sheets

FOREIGN PATENT DOCUMENTS

JP   2006-169265 A   6/2006
JP   2009-001788 A   1/2009

OTHER PUBLICATIONS

A. R. Brown et al., "Poly(p-phenylenevinylene) light-emitting diodes: Enhanced electroluminescent efficiency through charge carrier confinement", Appl. Phys. Lett. vol. 61, No. 23, pp. 2793-2794 (1992).

N. C. Greenham et al., "Efficient light-emitting diodes based on polymers with high electron affinities", Nature vol. 365, pp. 628-630 (Oct. 14, 1993).

Michelle Liu et al., "Effect of Cyano Substituents on Electron Affinity and Electron-Transporting Properties of Conjugated Polymers", Macromolecules, 2002, vol. 35, No. 9, pp. 3532-3538. (Abstract only).

* cited by examiner

COLOR CONVERSION FILM CONTAINING A CONJUGATED HIGH MOLECULAR WEIGHT COPOLYMER AND MULTICOLOR LIGHT-EMITTING ORGANIC EL DEVICE INCLUDING THE SAME

BACKGROUND OF THE INVENTION

1. Field of the Invention

The present invention relates to a color conversion film in the form of a solid-state, thin film that has fluorescence or phosphorescence, that can be processed by a coating process, and that is formed using a conjugated high molecular weight copolymer having high color conversion efficiency. Moreover, the present invention relates to a multicolor light-emitting organic EL device that is formed to include the color conversion film.

2. Background of the Related Art

Considerable research has been conducted on practical application of organic EL elements in recent years. Organic EL elements are expected to realize high photoluminescent brightness and photoluminescent efficiency since they are capable of realizing high current density at low voltages. Particularly high expectations are being placed on practical application of high-definition organic multicolor EL displays capable of multicolor or full-color display. An example of a method for realizing multicolor or full-color organic EL displays consists of using a plurality of types of color filters that allow transmission of light of a specific wavelength regime (color filter method). In the case of applying the color filter method, the organic EL element used is required to emit so-called "white light" comprising a proper balance of light of the three primary colors (red (R), green (G) and blue (B)) as multicolor light.

A method for obtaining multicolor light-emitting organic EL element is proposed in Japanese Patent Application Laid-open No. 2000-243563 (Patent Document 1) in which a light-emitting layer containing a plurality of luminescent pigments is used to simultaneously excite the plurality of luminescent pigments. In addition, U.S. Pat. No. 5,683,823 (Patent Document 2) proposes a method for causing energy transfer to a guest material and light emission simultaneous to causing excitation and emission of light from a host light-emitting material by using a light-emitting layer that contains a host light-emitting material and a guest light-emitting material.

However, the above-mentioned multicolor light-emitting organic EL elements depend on either simultaneous excitation of a plurality of types of light-emitting materials or energy transfer between a plurality of types of light-emitting materials. In such devices, the balance of emission intensity between the light-emitting materials has been reported to change as drive time elapses or accompanying changes in applied current, thereby resulting in the risk of a change in the resulting color hue.

Japanese Patent Application Laid-open No. 2002-75643 (Patent Document 3) and Japanese Patent Application Laid-open No. 2003-217859 (Patent Document 4) propose a color conversion method that uses a monochromatic light-emitting organic EL element and a color conversion film as another method for obtaining a multicolor light-emitting organic EL element. The color conversion film is a layer containing one or a plurality of color conversion substances that absorb light of a short wavelength and convert it to light of a long wavelength.

However, when a color conversion film is formed with a single color conversion substance, a phenomenon referred to as concentration quenching occurs. Concentration quenching refers to dissipation (quenching) of light without being emitted while energy absorbed by a color conversion substance repeatedly moves between molecules. In order to suppress this phenomenon, Japanese Patent Application Laid-open No. 2000-230172 (Patent Document 5) proposes a medium dispersion type of color conversion film that lowers the concentration of a color conversion substance in a color conversion film by dissolving or dispersing the color conversion substance in some type of medium. This medium dispersion type of color conversion film is able to inhibit contact between color conversion substances accompanying a decrease in concentration of the color conversion substance.

In this case, if the concentration of the color conversion substance is lowered, the absorbance of light to be absorbed decreases, preventing the obtaining of sufficient converted light intensity. In response to this problem, the thickness of the color conversion film is increased to increase absorbance and maintain color conversion efficiency. In the case of using a thick color conversion film (having a film thickness of about 10 μm) in this manner, problems occur such as a large level difference, difficulty in achieving high definition and residual moisture or solvent in the film. The presence of a large level difference results in the occurrence of wire breakage in the electrode patterns at the locations of level differences in the case of attempting to form an organic EL element on the color conversion film. In addition, the presence of residual moisture or solvent in the color conversion film causes deterioration of the organic EL layer by the residual moisture or solvent when combined with an organic EL element, thereby resulting in display defects.

Moreover, in a medium dispersion type of color conversion film as described above, the color conversion substance frequently diffuses into the medium and gathers to form aggregates with the passage of time, thereby causing concentration quenching. Thus, the use of this type of color conversion film makes it difficult to maintain high color conversion efficiency over a long period of time.

Therefore, in order to realize a color conversion film that is capable of maintaining sufficient converted light intensity over a long period of time without increasing thickness, a material is desired that has suitable absorption and emission spectra, has high fluorescent quantum yield, and does not cause concentration quenching when thickness is reduced. In the past, few materials were found that were able to efficiently absorb ultraviolet light or blue light and convert it to green, light, and there are particularly few materials useful for multicolor light-emitting organic EL devices using a color conversion film that are capable of efficiently absorbing blue light and converting it to green light. Thus, there was a strong desire to find such a color conversion film or material for realizing a multicolor light-emitting organic EL device using that color conversion film.

Moreover, in order to produce such a color conversion film at low cost, it is desirable to use a wet process such as a coating process that uses a solution of a color conversion material after dissolving the color conversion material in a suitable solvent. However, the color conversion substance is required to be soluble in order to achieve this. Moreover, from the viewpoint of the process, it is desirable that viscosity be able to be easily adjusted to a viscosity that is suitable for the apparatus used. In order to achieve this object, it is desirable to use a color conversion substance composed of a polymer material that offers a wide selection range of applicable solvents and enables viscosity to be easily adjusted by changing the molecular weight thereof.

Conventional examples of color conversion films using a polymer material include a color conversion film containing a polymer material having a polyarylenevinylene group as a repeating unit thereof proposed in Japanese Patent Application Laid-open No. 2000-26852 (Patent Document 6), and a color conversion film containing a polymer material having fluorene as a repeating unit thereof proposed in Japanese Patent Application Laid-open No. 2006-169265 (Patent Document 7). In addition, as described in Appl. Phys. Lett., 61, 2793 (1992) (Non-Patent Document 1) and Nature, 365, 628 (1992) (Non-Patent Document 2), polyarylenevinylene derivatives have been widely researched as candidates for light-emitting materials of polymer EL elements due to their comparatively high fluorescent quantum yield and high solubility. Color conversion films using polymer materials are also required to have high fluorescent quantum yield. However, the fluorescent quantum yields of polyarylenevinylene derivatives in the form of thin films that have been reported thus far have been on the order of 10 to 40%, thus demonstrating values that are inadequate for use as color conversion films.

An object of the present invention is to provide a green light-emitting color conversion film capable of maintaining sufficient converted light intensity over a long period of time without increasing thickness, and being able to be produced by a low-cost, wet process. In addition, another object of the present invention is to provide a multicolor light-emitting organic EL device using the color conversion film that has superior viewing angle dependency and demonstrates stable emission properties over a long period of time without a change in hue with the passage of drive time or accompanying a change in applied current.

SUMMARY OF THE INVENTION

As a result of conducting extensive studies, the inventors of the present invention found that fluorescent quantum yield when in the form of a thin film can be improved to about 60 to 70% by using a copolymer in which fluorene group repeating units are introduced into a polyarylenevinylene derivative. As a result of further studies, the inventors of the present invention found that fluorescent quantum yield can be further increased by employing a structure in which phenylene groups are bonded to both ends of fluorene groups, and the phenylene groups are introduced as spacers that prevent interaction between the fluorene groups and the arylenevinylene groups. The use of a polymer material having such a structure made it possible to reach a fluorescent quantum yield when in the form of a thin film of 80 to 90%.

A color conversion film of a first embodiment of the present invention is characterized by containing a conjugated high molecular weight copolymer that has a structure represented by the following formula (1):

C1:

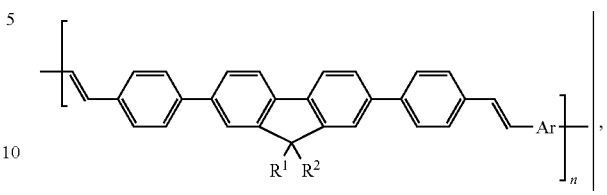

wherein Ar represents an arylene group or divalent heterocyclic group, $R^1$ and $R^2$ respectively and independently represent a hydrogen atom, alkyl group, alkoxy group, alkylthio group, alkylsilyl group, alkylamino group, aryl group, aryloxy group, arylalkyl group, arylalkoxy group, arylalkenyl group, arylalkynyl group, monovalent heterocyclic group, amino group, nitro group, halogen group or cyano group, and n represents an integer of 1 to 10000, and has a green emission peak wavelength of 490 to 580 nm when in the form of a thin film. Here, the conjugated high molecular weight copolymer represented by formula (1) may also have a structure represented by the following formula (2):

C2:

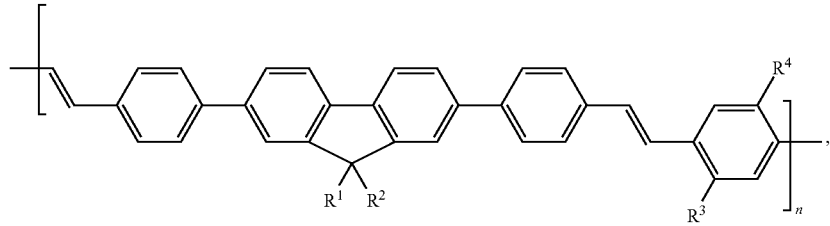

wherein, $R^1$, $R^2$, $R^3$ and $R^4$ respectively and independently represent a hydrogen atom, alkyl group, alkoxy group, alkylthio group, alkylsilyl group, alkylamino group, aryl group, aryloxy group, arylalkyl group, arylalkoxy group, arylalkenyl group, arylalkynyl group, monovalent heterocyclic group, amino group, nitro group, halogen group or cyano group, and n represents an integer of 1 to 10000. In addition, the conjugated high molecular weight copolymer represented by formula (1) may have a weight average molecular weight of 1000 to 500,000. In addition, the color conversion film containing the conjugated high molecular weight copolymer represented by formula (1) may be formed by a coating process.

A multicolor light-emitting organic EL device of a second embodiment of the present invention is a multicolor light-emitting organic EL device containing a pair of electrodes, at least one of which is a transparent electrode, an organic EL layer interposed between the pair of electrodes, and a color conversion film of the first embodiment, and is characterized in that the color conversion film has a film thickness of 2 μm or less. Here, the multicolor light-emitting organic EL device may have the color conversion film and the transparent electrode arranged in mutual contact.

In the present invention, the use of a conjugated high molecular weight copolymer, having a structure having alternating fluorene group-containing repeating units and arylenevinylene repeating units and having phenylene groups inserted as spacers on both ends of the fluorene groups, as a color conversion material makes it possible to improve fluorescent quantum yield when in the form of a thin film and obtain sufficient color conversion efficiency for use as a color conversion film.

The color conversion film of the present invention is able to maintain high color conversion efficiency without increasing thickness despite being a color conversion film composed of a single material. In addition, in the present invention, a color conversion film can be provided that can be formed by a low-cost, wet process by selecting a polymer material that is soluble in solvent. In addition, a multicolor light-emitting organic EL device formed using such a color conversion film has low viewing angle dependency and is able to demonstrate stable emission properties over a long period of time without changing hue with the passage of drive time or accompanying a change in applied current.

DETAILED DESCRIPTION OF THE INVENTION

Figure 1A:
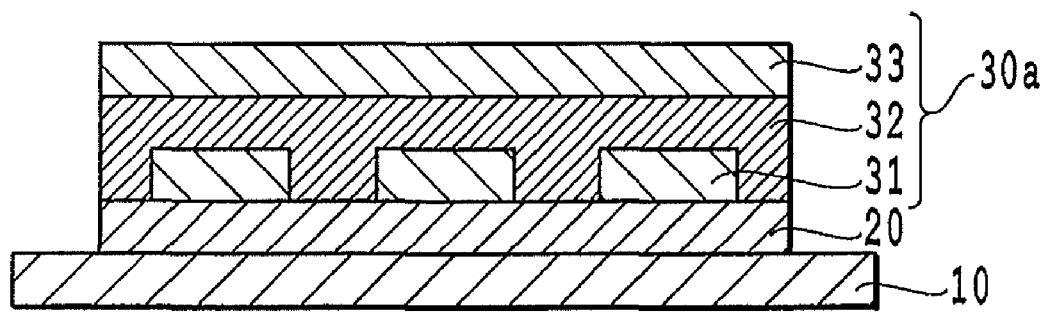
FIG. 1A is a drawing showing an example of the configuration of a multicolor light-emitting organic EL device of the present invention.

The color conversion film of a first embodiment of the present invention is characterized by containing a conjugated high molecular weight polymer that has a structure having alternating fluorene group-containing repeating units and arylenevinylene repeating units and having phenylene groups inserted as spacers on both ends of the fluorene groups, and has a green emission peak wavelength of 490 to 580 nm when in the form of a thin film.

The conjugated high molecular weight copolymer used in the present invention is preferably a compound represented by the following general formula (1) [arylenevinylene/(phenylene-fluorene-phenylene-vinylene) alternating copolymer].

The arrangement of repeating units in the conjugated high molecular weight copolymer is preferably that of a so-called alternating copolymer in which arylenevinylene repeating units and fluorene group-containing repeating units are alternately bonded from the viewpoint of phenylene groups functioning as spacers between the arylenevinylene groups and the fluorene groups.

C3:

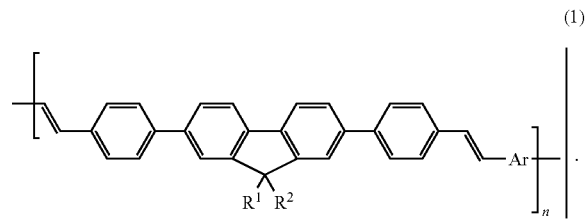

In formula (1) above, Ar represents an arylene group or divalent heterocyclic group. Here, an arylene group refers to an atomic group in which two hydrogen atoms have been removed from a monocyclic aromatic hydrocarbon or condensed polycyclic aromatic hydrocarbon. A preferable monocyclic condensed aromatic hydrocarbon contains a substituted or non-substituted benzene ring. A preferable condensed polycyclic aromatic hydrocarbon is an aromatic compound that normally has about 6 to 60 carbon atoms contained in a ring and has 2 to 5 condensed benzene rings. More specifically, examples of condensed polycyclic aromatic hydrocarbons include naphthalene, anthracene, phenanthrene, pyrene, perylene, naphthacene, pentacene, chrysene and coronene. Preferable examples of condensed polycyclic aromatic hydrocarbons include naphthalene or anthracene.

In addition, in formula (1) above, $R^1$ and $R^2$ respectively and independently represent a hydrogen atom, alkyl group, alkoxy group, alkylthio group, alkylsilyl group, alkylamino group, aryl group, aryloxy group, arylalkyl group, arylalkoxy group, arylalkenyl group, arylalkynyl group, monovalent heterocyclic group, amino group, nitro group, halogen group or cyano group, and n represents an integer of 1 to 10000.

Among the conjugated high molecular weight copolymers represented by formula (1), a conjugated high molecular weight copolymer represented by the following formula (2), in which Ar represents a substituted or non-substituted 1,4-phenylene group, is preferable.

C4:

In formula (2) above, $R^1$, $R^2$, $R^3$ and $R^4$ respectively and independently represent a hydrogen atom, alkyl group, alkoxy group, alkylthio group, alkylsilyl group, alkylamino group, aryl group, aryloxy group, arylalkyl group, arylalkoxy group, arylalkenyl group, arylalkynyl group, monovalent heterocyclic group, amino group, nitro group, halogen group or cyano group, and n represents an integer of 1 to 10000.

The alkyl group in the present invention may be linear, branched or cyclic and normally has 1 to 20 carbon atoms. Specific examples of alkyl groups in the present invention include a methyl group, ethyl group, n-propyl group, i-propyl group, n-butyl group, i-butyl group, t-butyl group, pentyl group, hexyl group, cyclohexyl group, heptyl group, octyl group, 2-ethylhexyl group, nonyl group, decyl group, 3,7-dimethyloctyl group and lauryl group. Preferable examples of alkyl groups include a pentyl group, hexyl group, octyl group, 2-ethylhexyl group, decyl group and 3,7-dimethyloctyl group.

The alkoxy group in the present invention may be linear, branched or cyclic and normally has 1 to 20 carbon atoms. Specific examples of alkoxy groups in the present invention include a methoxy group, ethoxy group, n-propyloxy group, i-propyloxy group, n-butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group and lauryloxy group. Preferable examples of alkoxy groups include a pentyloxy group, hexyloxy group, octyloxy group, 2-ethylhexyloxy group, decyloxy group and 3,7-dimethyloctyloxy group.

The alkylthio group in the present invention may be linear, branched or cyclic, and normally has 1 to 20 carbon atoms. Specific examples of alkylthio groups in the present invention include a methylthio group, ethylthio group, n-propylthio group, i-propylthio group, n-butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group and laurylthio group. Preferable examples alkylthio groups include a pentylthio group, hexylthio group, octylthio group, 2-ethylhexylthio group, decylthio group and 3,7-dimethyloctylthio group.

The alkylsilyl group in the present invention may be linear, branched or cyclic, normally has 1 to 20 carbon atoms, and the alkylsilyl group in the present invention may be a monoalkylsilyl group, dialkylsilyl group or trialkylsilyl group. Specific examples of alkylsilyl groups include a methylsilyl group, ethylsilyl group, n-propylsilyl group, i-propylsilyl group, n-butylsilyl group, i-butylsilyl group, t-butylsilyl group, pentylsilyl group, hexylsilyl group, cyclohexylsilyl group, heptylsilyl group, octylsilyl group, 2-ethylhexylsilyl group, nonylsilyl group, decylsilyl group, 3,7-dimethyloctylsilyl group and laurylsilyl group. Preferable examples of alkylsilyl groups include a pentylsilyl group, hexylsilyl group, octylsilyl group, 2-ethylhexylsilyl group, decylsilyl group and 3,7-dimethyloctylsilyl group.

The alkylamino group in the present invention may be linear, branched or cyclic, may be a monoalkylamino group or dialkylamino group, and normally has 1 to 40 carbon atoms. Specific examples of alkylamino groups in the present invention include a methylamino group, dimethylamino group, ethylamino group, diethylamino group, n-propylamino group, i-propylamino group, n-butylamino group, i-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group and laurylamino group. Preferable examples of alkylamino groups include a pentylamino group, hexylamino group, octylamino group, 2-ethylhexylamino group, decylamino group and 3,7-dimethyloctylamino group.

The aryl group in the present invention normally has 6 to 60 carbon atoms. Specific examples of aryl groups in the present invention include a phenyl group, $C_1$-$C_{12}$ alkoxyphenyl group (wherein, $C_1$-$C_{12}$ indicates 1 to 12 carbon atoms, and to apply similarly hereinafter), $C_1$-$C_{12}$ alkylphenyl group, 1-naphthyl group and 2-naphthyl group. Preferable examples of aryl groups include a $C_1$-$C_{12}$ alkoxyphenyl group and $C_1$-$C_{12}$ alkylphenyl group.

The aryloxy group in the present invention normally has 6 to 60 carbon atoms. Examples of aryloxy groups in the present invention include a phenoxy group, $C_1$-$C_{12}$ alkoxyphenoxy group, $C_1$-$C_{12}$ alkylphenoxy group, 1-naphthyloxy group and 2-naphthyloxy group. Preferable examples of aryloxy groups include a $C_1$-$C_{12}$ alkoxyphenoxy group and $C_1$-$C_{12}$ alkylphenoxy group.

The arylalkyl group in the present invention normally has 7 to 60 carbon atoms. Specific examples of arylalkyl groups in the present invention include a phenyl-$C_1$-$C_{12}$ alkyl group, $C_1$-$C_{12}$ alkoxyphenyl-$C_1$-$C_{12}$ alkyl group, $C_1$-$C_{12}$ alkylphenyl-$C_1$-$C_{12}$ alkyl group, 1-naphthyl-$C_1$-$C_{12}$ alkyl group and 2-naphthyl-$C_1$-$C_{12}$ alkyl group. Preferable examples of arylalkyl groups include a $C_1$-$C_{12}$ alkoxyphenyl-$C_1$-$C_{12}$ alkyl group and $C_1$-$C_{12}$ alkylphenyl-$C_1$-$C_{12}$ alkyl group.

The arylalkoxy group in the present invention normally has 7 to 60 carbon atoms. Specific examples of arylalkoxy groups in the present invention include a phenyl-$C_1$-$C_{12}$ alkoxy group, alkoxyphenyl-$C_1$-$C_{12}$ alkoxy group, $C_1$-$C_{12}$ alkylphenyl-$C_1$-$C_{12}$ alkoxy group, 1-napthyl-$C_1$-$C_{12}$ alkoxy group and 2-naphthyl-$C_1$-$C_{12}$ alkoxy group. Preferable examples of arylalkoxy groups include a $C_1$-$C_{12}$ alkoxyphenyl-$C_1$-$C_{12}$ alkoxy group and $C_1$-$C_{12}$ alkylphenyl-$C_1$-$C_{12}$ alkoxy group.

The arylamino group in the present invention normally has 6 to 60 carbon atoms. The arylamino group in the present invention may be a monoarylamino group or diarylamino group, and specific examples include a phenylamino group, diphenylamino group, $C_1$-$C_{12}$ alkylphenylamino group, di($C_1$-$C_{12}$ alkylphenyl)amino group, $C_1$-$C_{12}$ alkoxyphenylamino group, di($C_1$-$C_{12}$ alkoxyphenyl)amino group, di($C_1$-$C_{12}$ alkylphenyl)amino group, 1-napthylamino group and 2-naphthylamino group. Preferable examples of arylalkoxy groups include a $C_1$-$C_{12}$ alkylphenylamino group and di($C_1$-$C_{12}$ alkylphenyl)amino group.

The arylalkenyl group in the present invention normally has 8 to 60 carbon atoms. Specific examples of arylalkenyl groups in the present invention include a phenyl-$C_2$-$C_{12}$ alkenyl group, $C_1$-$C_{12}$ alkoxyphenyl-$C_2$-$C_{12}$ alkenyl group, $C_1$-$C_{12}$ alkenylphenyl-$C_2$-$C_{12}$ alkenyl group, 1-naphthyl-$C_1$-$C_{12}$ alkenyl group and 2-naphthyl-$C_2$-$C_{12}$ alkenyl group. Preferable examples of arylalkenyl groups include a alkoxyphenyl-$C_2$-$C_{12}$ alkenyl group and $C_1$-$C_{12}$ alkylphenyl-$C_2$-$C_{12}$ alkenyl group.

The arylalkynyl group in the present invention normally has 8 to 60 carbon atoms. Specific examples of arylalkynyl groups in the present invention include a phenyl-$C_2$-$C_{12}$ alkynyl group, $C_1$-$C_{12}$ alkoxyphenyl-$C_2$-$C_{12}$ alkynyl group, $C_1$-$C_{12}$ alkenylphenyl-$C_2$-$C_{12}$ alkynyl group, 1-napthyl-$C_1$-$C_{12}$ alkynyl group and 2-naphthyl-$C_2$-$C_{12}$ alkynyl group. Preferable examples include a $C_1$-$C_{12}$ alkoxyphenyl-$C_2$-$C_{12}$ alkynyl group and $C_1$-$C_{12}$ alkylphenyl-$C_2$-$C_{12}$ alkynyl group.

The monovalent heterocyclic group in the present invention normally has 4 to 60 carbon atoms. Specific examples of monovalent heterocyclic groups in the present invention include a thienyl group, $C_1$-$C_{12}$ alkylthienyl group, pyrrolyl group, furyl group, pyridyl group and $C_1$-$C_{12}$ alkylpyridyl group. Preferable examples of monovalent heterocyclic groups include a thienyl group, $C_1$-$C_{12}$ alkylthienyl group, pyridyl group and $C_1$-$C_{12}$ alkylpyridyl group. A monovalent heterocyclic group refers to an atomic group that remains after removing a single hydrogen atom from a heterocyclic compound.

The conjugated high molecular weight copolymer used in the color conversion film of the present invention emits green light having a peak wavelength of 490 to 580 nm when in the form of a thin film. The conjugated high molecular weight copolymer used in the color conversion film of the present invention has a weight average molecular weight within the range of 1000 to 500,000 and more preferably within the range of 5000 to 200,000. Fewer components having a low degree of polymerization are preferable for enhancing the durability of the color conversion film, and oligomers having a degree of polymerization of 5 or less are preferably not contained.

A specific example of a conjugated high molecular weight copolymer represented by general formula (2) (American Dye Source, Inc.: 125GE) is shown below.

C5:

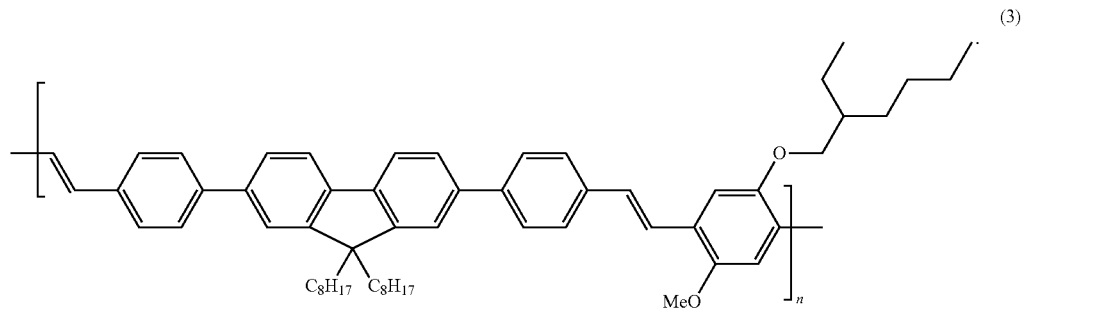

(3)

Even in the case of, for example, an organic fluorescent material having high fluorescent quantum yield when in the form of a dilute solution, when a solid-state thin film is formed, the fluorescent quantum yield typically decreases considerably due to concentration quenching effects based on strong intermolecular interaction. As an example thereof, in contrast to previously reported polyarylenevinylene compounds demonstrating fluorescent quantum yield of about 80 to 90% when in the form of a dilute solution, fluorescent quantum yield when in the form of a thin film was only about 10 to 40%. Thus, previously reported polyarylenevinylene compounds were inadequate for use as color conversion films.

In the present invention, however, a compound represented by chemical formula (1) has extremely high fluorescent quantum yield of 80 to 90% even when in the form of a thin film, and was found to be a material that can adequately withstand practical application as a color conversion film.

The reason why the conjugated high molecular weight copolymer having a chemical structure represented by chemical formula (1) demonstrates high fluorescent quantum yield even when in the form of a thin film can be discussed in the manner indicated below.

In general, excitons occurring on a polymer chain either lose energy by emitting light (emission annihilation) or lose their energy by a route other than emission of light (non-emission annihilation). In order to improve fluorescent quantum yield, it is necessary to reduce the proportion of excitons that undergo non-emission annihilation among the total number of excitons generated. The most likely cause of non-emission annihilation in a polymer thin film is annihilation based on energy transfer caused by contact between different units contained in the same polymer chain. Although excitons occurring on a polymer chain are thought to rapidly disperse on the chain, if another unit differing from the unit that composes the site where an exciton is present contacts that site at that time, the excitation energy is transferred to that unit resulting in non-emission annihilation.

A first effect demonstrated by the chemical structure of formula (1) is the imparting of rigidity to the polymer chain due to the introduction of fluorene groups. Since materials having a rigid polymer chain have a lower probability of contact between different units, fluorescent quantum yield tends to be high. Conversely, materials having a flexible and bendable polymer chain facilitate contact between different units and fluorescent quantum yield tends to be low. Fluorene groups are highly rigid substituents, and the introduction of fluorene groups is known to have the effect of imparting rigidity to polymer chains. As a result of introducing fluorene group-containing repeating units into arylenevinylene repeating units, a high degree of rigidity is imparted to the polymer chain, and this is thought to increase fluorescent quantum yield when in the form of a thin film.

A second effect demonstrated by the chemical structure of formula (1) is the effect of inhibiting concentration quenching due to the introduction of repeating units containing fluorene. Polyfluorene, which is composed only of fluorene groups, is known to be a material that absorbs in the ultraviolet regime and emits blue light. In comparison with this polyfluorene, arylenevinylene groups are thought to mainly contribute to absorption and emission (green light) of backlight (wavelength: 470 nm) in an alternating copolymer represented by formula (1). Namely, repeating units containing fluorene are thought to function as spacers that pull apart the arylenevinylene groups and inhibit their interaction without contributing to emission of light.

A third effect demonstrated by the chemical structure of formula (1) is the effect of inhibiting interaction between arylenevinylene groups and fluorene groups due to the presence of phenylene groups introduced on both ends of the fluorene groups. As was previously described, arylenevinylene groups are thought to mainly contribute to absorption and emission of backlight. However, if arylenevinylene groups and fluorene groups were to be bonded directly, a portion of the excitation energy would be subjected to non-emission annihilation as a result of transferring to an adjacent fluorene group, thereby resulting in the possibility of a decrease in fluorescent quantum yield. However, in a compound represented by chemical formula (1), a structure is employed in which phenylene groups are inserted between the arylenevinylene groups and fluorene groups. This being the case, the phenylene groups function as spacers in compounds represented by formula (1), interaction between arylenevinylene groups and fluorene groups is inhibited, and high fluorescent quantum yield is thought to be achieved as a result thereof.

The color conversion film of the present invention has a film thickness of 2000 nm (2 μm) or less, preferably 100 to 2000 nm and more preferably 400 to 1000 nm. In the color conversion film of the present invention, since the fluorescent quantum yield of the above-mentioned conjugated high molecular weight copolymer (compound represented by formula (1) or formula (2)) is maintained at a high level even when in the form of a thin film, the color conversion film has sufficient color conversion efficiency even if it has a thin film thickness in this manner.

The color conversion film of the present embodiment can be produced by coating the conjugated high molecular weight copolymer onto a suitable transparent support. Alternatively, as will be subsequently described, a color conversion film may also be produced by coating a solution containing the conjugated high molecular weight copolymer along with other elements onto a suitable transparent support.

The material able to be used for the transparent support may be an organic material in the manner of glass or may be a polymer material in the manner of a cellulose ester such as diacetyl cellulose, triacetyl cellulose (TAC), propionyl cellulose, butyryl cellulose or nitrocellulose, a polyamide, a polycarbonate, a polyester such as polyethylene terephthalate, polyethylene naphthalate or polybutylene terephthalate, a polystyrene, a polyolefin such as polyethylene, polypropylene or polymethylpentene, an acrylic resin such as polymethyl methacrylate, a polycarbonate, a polysulfone, a polyethersulfone, a polyetherketone, a polyetherimide, a polyoxyethylene or a norbornene resin. In the case of using a polymer material, the transparent support may be rigid or flexible. The transparent support preferably has transmittance of 80% or more, and more preferably 86% or more, with respect to visible light.

The color conversion film of the present embodiment may also be formed as a free-standing film by coating a solution containing the conjugated high molecular weight copolymer onto a temporarily support and then separating the resulting coating from the temporarily support. The solution used for coating may also further contain other elements to be subsequently described. In addition, an opaque support made of metal or ceramics and the like can also be used for the temporary support in addition to the above-mentioned transparent support.

The color conversion film of the present invention may also contain an oxygen absorber in an amount that does not have a detrimental effect on the color conversion properties thereof. This is because the conjugated high molecular weight copolymer represented by formula (1) and the conjugated high molecular weight copolymer represented by formula (2) are easily oxidized in the case of being irradiated with light in the presence of oxygen, thereby resulting in the risk of a decrease in fluorescent quantum yield. Therefore, in the color conversion film of the present invention, the containing of an oxygen absorber makes it possible to prevent oxidation of the conjugated high molecular weight copolymer and therefore prevent a decrease in fluorescent quantum yield of the color conversion film.

Examples of oxygen absorbers that can be used include metals such as iron, aluminum, lithium, sodium, zinc or barium, inorganic compounds such as cuprous oxide or ferrous chloride, and organic compounds such as hydroquinone or aniline.

In addition, the color conversion film of the present invention can be provided with an oxygen blocking film on the surface thereof that blocks out oxygen in the atmosphere. The oxygen blocking film preferably allows sufficient transmission of converted light of the color conversion film. The oxygen blocking film prevents oxidation of the conjugated high molecular weight polymer by blocking the entrance of oxygen in the atmosphere into the color conversion film, thereby making it possible to prevent a decrease in the fluorescent quantum yield thereof.

Examples of oxygen blocking films that can be used include plastic films such as polycarbonate, polyethylene terephthalate or Nylon films, films of inorganic materials such as aluminum foil, silicon oxide film or silicon nitride film, and composite films having aluminum, silicon oxide or silicon nitride laminated on any of the plastic films described above.

A multicolor light-emitting organic EL device of a second embodiment of the present invention is characterized by containing an organic EL element and the color conversion film of the first embodiment, and the organic EL device contains a pair of electrodes, of which at least one is transparent, and an organic EL layer interposed between the pair of electrodes.

FIGS. 1A to 1D show examples of the structure of the multicolor light-emitting organic EL device of the present invention. The device of FIG. 1A has a configuration consisting of a transparent substrate 10, a color conversion film 20 and organic EL element 30a, and the organic EL element 30a comprises a transparent electrode 31, an organic EL layer 32 and a reflective electrode 33. The device of FIG. 1A has a configuration in which the color conversion film 20 and the transparent electrode 31 are in contact, and is a so-called bottom emission type of device in which light is radiated onto the side of the transparent substrate 10. The device of FIG. 1B has a configuration consisting of a substrate 11, an organic EL element 30b and the color conversion film 20. Although the organic EL element 30b comprises the transparent electrode 31, the organic EL layer 32 and the reflective electrode 33 in the same manner as the organic EL element 30a, the order in which they are laminated is reversed. The device of FIG. 1B has a configuration in which the color conversion film 20 and the transparent electrode 31 are in contact, and is a so-called top emission type of device in which light is radiated onto the opposite side of the substrate 11.

Figure 1B:
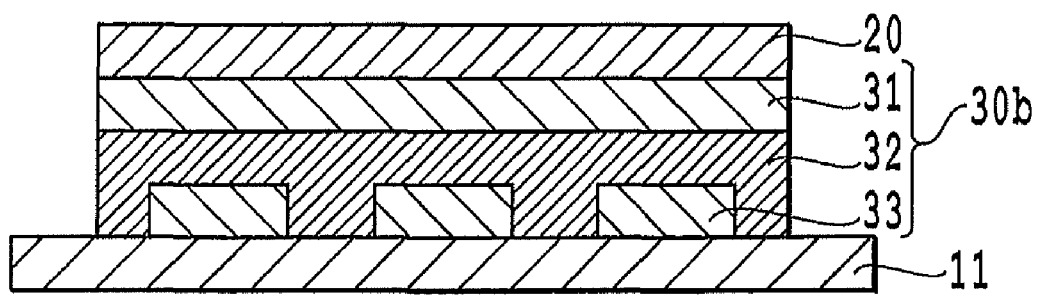
FIG. 1B is a drawing showing another example of the configuration of a multicolor light-emitting organic EL device of the present invention.

In the devices of FIG. 1A and FIG. 1B, one of the pair of electrodes is the transparent electrode 31, and light emitted with the organic EL layer 32 (EL light) is radiated in the direction of the transparent electrode 31 either directly or as a result of being reflected by the reflective electrode 33, and enters the color conversion film 20. A portion of the EL light is absorbed by the conjugated high molecular weight copolymer and radiated as light having a different wavelength distribution (photoluminescent light, PL light). The device functions as an organic EL device that emits multicolor light due to EL light not absorbed by the color conversion film 20 and the PL light.

Figure 1C:
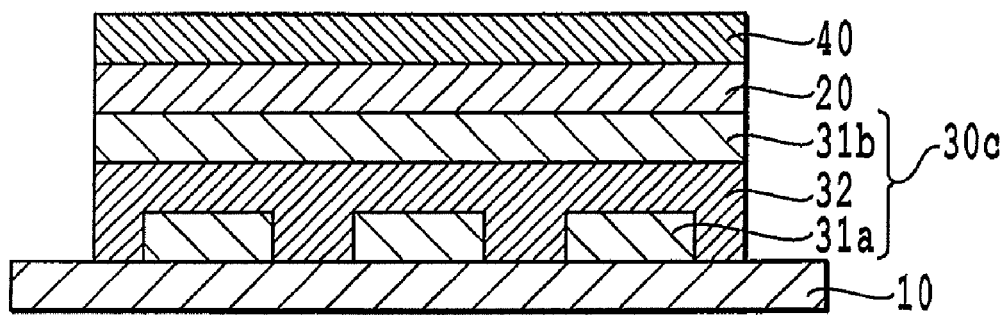
FIG. 1C is a drawing showing a further example of the configuration of a multicolor light-emitting organic EL device of the present invention.

On the other hand, the device of FIG. 1C has a configuration consisting of the transparent substrate 10, an organic EL element 30c, the color conversion film 20 and a reflective layer 40, and the organic EL element 30c indicated here comprises a first transparent electrode 31a, the organic EL layer 32 and a second transparent electrode 31b. The device of FIG. 1C is a bottom emission type of device. The device of FIG. 1D has a configuration consisting of the substrate 11, the reflective layer 40, the color conversion film 20 and the organic EL element 30c. The device of FIG. 1D is a top emission type of device.

Figure 1D:
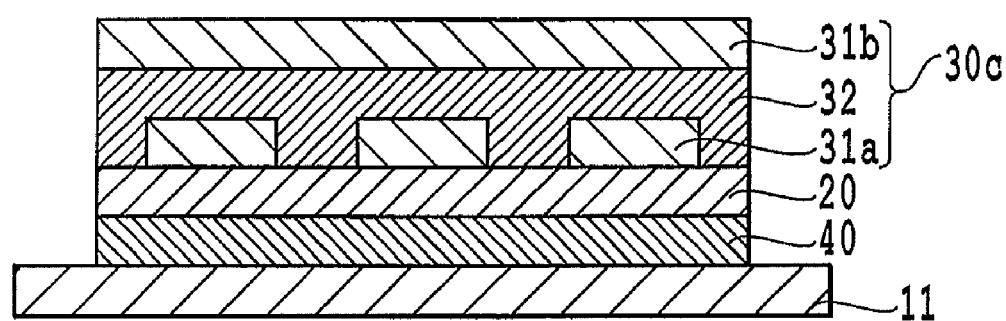
FIG. 1D is a drawing showing yet another example of the configuration of a multicolor light-emitting organic EL device of the present invention.

In the devices of FIG. 1C and FIG. 1D, both of the pair of electrodes are transparent electrodes 31 (31a and 31b), and a portion of the EL light emitted by the organic EL layer 32 is radiated to the outside without passing through the color conversion film 20 (in the direction of the transparent substrate 10 in FIG. 1C, and in the direction of the second transparent electrode 31b in FIG. 1D). A portion of the EL light emitted towards the direction of the color conversion film 20 is absorbed by the color conversion film 20 and converted to PL light. Moreover, light that has passed through the color conversion film 20 is reflected by the reflective layer 40, re-enters the color conversion film 20 where it is subjected to wavelength distribution conversion, and then passes through the organic EL element 30c and is radiated to the outside.

In all of the devices of FIGS. 1A to 1D, the color conversion film 20 is arranged in contact with the transparent electrode 31 (including the first and second transparent electrodes 31a and 31b). This arrangement is effective for improving incident efficiency of EL light entering the color conversion film 20 by minimizing the distance between the organic EL layer 32 and the color conversion film 20, while at the same time reducing viewing angle dependency.

Whether or not any of the above-mentioned configurations are employed is determined depending on the desired device application, the hue required by the device and the like. The following provides a description of each of the constituent features of the multicolor light-emitting organic EL device of the second embodiment of the present invention.

The transparent substrate 10 and the substrate 11 preferably have durability with respect to the conditions used to form the laminated layers (such as solvent and temperature), as well as dimensional stability.

The material of the transparent substrate 10 used in the bottom emission type configurations of FIGS. 1A and 1C may be an inorganic material such as glass, or a polymer material in the manner of a cellulose ester such as diacetyl cellulose, triacetyl cellulose (TAC), propionyl cellulose, butyryl cellulose or nitrocellulose, a polyamide, a polycarbonate, a polyester such as polyethylene terephthalate, polyethylene naphthalate, polybutylene terephthalate or polybutylene terephthalate, a polystyrene, a polyolefin such as polyethylene, polypropylene or polymethylpentene, an acrylic resin such as polymethyl methacrylate, a polycarbonate, a polysulfone, a polyethersulfone, a polyetherketone, a polyetherimide, a polyoxyethylene or a norbornene resin. In the case of using a polymer material, the transparent substrate 10 may be rigid or flexible. The transparent substrate 10 preferably has transmittance of 80% or more, and more preferably 86% or more, with respect to visible light.

On the other hand, since the substrate 11 used in the top emission type configuration of FIGS. 1B and 1D is not required to be transparent, a material such as metal or ceramics, can be used in addition to the materials used for the transparent substrate 10 described above.

The transparent electrode 31 (including the first and second transparent electrodes 31a and 31b) preferably have transmittance with respect to light having a wavelength of 400 to 800 nm of 50% or more and more preferably 85% or more. The transparent electrode 31 can be formed using an electrically conductive transparent metal oxide in which a dopant such as F or Sb is added to ITO (In—Sn oxide), Sn oxide, In oxide, IZO (In—Zn oxide), Zn oxide, Zn—Al oxide, Zn—Ga oxide or a combination thereof. The transparent electrode 31 is formed using sputtering or chemical vapor deposition (CVD), and is preferably formed using sputtering. In addition, in the case of requiring the transparent electrode 31 to be composed of a plurality of partial electrodes as will be subsequently described, an electrically conductive transparent metal oxide is uniformly formed over the entire surface followed by etching to impart a desired pattern to form the transparent electrode 31 composed of a plurality of partial electrodes.

The transparent electrode 31 formed from the materials described above is suitable for use as an anode. On the other hand, in the case of using the transparent electrode 31 as a cathode, it is preferable to provide a cathode buffer layer at the interface with the organic EL layer 32 to improve electron injection efficiency. Although an alkaline metal such as Li, Na, K or Cs, an alkaline earth metal such as Ba or Sr or an alloy containing those metals, a rare earth metal, or a fluoride of those metals can be used for the material of the cathode buffer layer, the material is not limited thereto. Although the film thickness of the cathode buffer layer can be suitably selected in consideration of drive voltage, transparency and the like, it is preferably 10 nm or less in ordinary cases.

The organic EL layer 32 has a structure that at least contains an organic light-emitting layer, and has a hole injection layer, hole transport layer, electron transport layer and/or electron injection layer interposed as necessary. More specifically, the organic EL element employs a structure composed of a layered structure as indicated below:

(1) anode/organic light-emitting layer/cathode,
(2) anode/hole injection layer/organic light-emitting layer/cathode,
(3) anode/organic light-emitting layer/electron injection layer/cathode,
(4) anode/hole injection layer/organic light-emitting layer/electron injection layer/cathode,
(5) anode/hole transport layer/organic light-emitting layer/electron injection layer/cathode,
(6) anode/hole injection layer/hole transport layer/organic light-emitting layer/electron injection layer/cathode, or
(7) anode/hole injection layer/hole transport layer/organic light-emitting layer/electron transport layer/electron injection layer/cathode.

In the layered structures described above, the anode and the cathode are either the transparent electrode 31 (including the first and second transparent electrodes 31a and 31b) or the reflective electrode 33, respectively.

A known material can be used for the material of each layer that composes the organic EL layer 32. For example, a material such as a benzothiazole-based, benzoimidazole-based or benzoxazole-based fluorescent whitening agent, a metal-chelating oxonium compound, or a styryl benzene-based compound can be preferably used as a material of the organic light-emitting layer for obtaining green emitted light from blue light.

Examples of materials of the electron transport layer that can be used include oxadiazole derivatives in the manner of 2-(4-biphenyl)-5-(p-t-butylphenyl)-1,3,4-oxadiazole (PBD), triazole derivatives, triazine derivatives, phenylquinoxaline and quinolinol complexes of aluminum (such as Alq$_3$). Examples of materials of the electron injection layer that can be used include the above-mentioned materials of the electron transport layer as well as quinolinol complexes of aluminum doped with alkaline metals or alkaline earth metals.

Examples of materials of the hole transport layer that can be used include known materials containing triarylamine-based materials such as TPD, N,N'-bis(1-naphthyl)-N,N'-diphenylbiphenylamine (α-NPD) or 4,4',4"-tris(N-3-tolyl-N-phenylamino)triphenylamine (m-MTDATA). Examples of materials of the hole injection layer that can be used include phthalocyanines (such as copper phthalocyanine) and indanthrene-based compounds.

The reflective electrode 33 is preferably formed using a metal, amorphous alloy or microcrystalline alloy having high reflectance. Examples of high reflectance metals include Al, Ag, Mo, W, Ni and Cr. Examples of high reflectance amorphous alloys include NiP, NiB; CrP and CrB. Examples of high reflectance microcrystalline alloys include NiAl. The reflective electrode 33 may be used as a cathode or as an anode. In the case of using the reflective electrode 33 as a cathode, the previously described cathode buffer layer may be provided at the interface between the reflective electrode 33 and the organic EL layer 32 to improve the efficiency of injection of electrons into the organic EL layer 32. Alternatively, in the case of using the reflective electrode 33 as a cathode, an alkaline metal such as lithium, sodium or potassium or an alkaline earth metal such as calcium, magnesium or strontium, which are materials having a small work function, can be added to the above-mentioned high reflectance metal, amorphous alloy or microcrystalline alloy to form an alloy and improve electron injection efficiency. In the case of using the transparent electrode 33 as an anode, a layer of the above-mentioned electrically conductive transparent metal oxide may be provided at the interface of the reflective electrode 33 and the organic EL layer 32 to improve the efficiency of injection of holes into the organic EL layer 32.

The reflective electrode 33 can be formed using arbitrary means known in the art depending on the materials used, examples of which include deposition (resistance heating or electron beam heating), sputtering, ion plating and laser abrasion. As will be described below, in cases requiring the reflective electrode 33 to be composed of a plurality of partial electrodes, the reflective electrode 33 composed of a plurality of partial electrodes may be formed by using a mask that imparts a desired shape.

In FIGS. 1A to 1D, examples are shown in which each of the pair of electrodes is formed from a plurality of portions in the form of parallel stripes, and a stripe that forms one of the electrodes and a stripe that forms the other electrode mutually intersect (and preferably intersect orthogonally) in order to form a plurality of independent light-emitting portions in the organic EL elements 30a to 30c. Thus, by employing a configuration as shown in the drawings, these organic EL elements can carry out matrix driving. Namely, when a voltage is applied to a specific stripe of one of the electrodes and a specific stripe of the other electrode, the organic EL layer 32 emits light at the portion where these stripes intersect. Alternatively, one of the electrodes may be a uniformly flat electrode that does not have a particular stripe pattern, and the other electrode may be patterned into a plurality of partial electrodes so as to correspond to each light-emitting portion. In this case, so-called active matrix driving can be carried out by providing a plurality of switching elements corresponding to each light-emitting portion and connecting the switching-elements one-to-one to the above-mentioned partial electrodes corresponding to each of the light-emitting portions. Alternatively, in the case an organic EL device is desired that uniformly emits light over the entire surface of the device, each electrode of the pair of electrodes can be a uniformly flat electrode.

The reflective layer 40 is preferably formed using a previously described high reflectance metal (such as Al, Ag, Mo, W, Ni and Cr), amorphous alloy (such as NIP, NiB, CrP and CrB) or microcrystalline alloy (such as NiAl). In the case the color conversion film 20 in the present invention is a thin film, there is the possibility of the occurrence of a short-circuit between the lower electrodes (between 31a) or between the upper electrodes (between 31b) through the reflective layer 40. In order to prevent a short-circuit, an insulating layer may be provided between the reflective layer 40 and the color conversion film 20 or between the color conversion film 20 and the electrodes (lower electrodes 31a or upper electrodes 31b). The insulating layer can be formed using a transparent insulating inorganic material such as $TiO_2$, $ZrO_2$, $AlO_x$, AlN or $SiN_x$ that has a refractive index near that of the color conversion film 20 (and preferably about 1.5 to 2.0).

In the multicolor light-emitting organic EL device of the present invention, the type of conjugated high molecular weight copolymer that composes the color conversion film 20 can be changed, or the amount of EL light absorbed in the color conversion film 20 can be adjusted by adjusting the film thickness of the color conversion film 20. In addition to adjusting the amount of EL light absorbed and adjusting the amount of PL light radiated according to these methods, by suitably selecting the arrangement of the color conversion element 20 as shown in FIGS. 1A to 1D, the multicolor light-emitting organic EL device of the present invention can emit light of an arbitrary hue, including white light.

The multicolor light-emitting organic EL device of the present invention can be used as a planar emission source (backlight) for producing a display (monochrome display or multicolor display combining the use of a color filter) by forming each of the pair of electrodes into a single unit. Alternatively, the multicolor light-emitting organic EL device of the present invention can be used as a monochrome display or a multicolor display combining the use of a color filter by forming the pair of electrodes so as to enable matrix driving as previously described.

Example 1

1737 glass manufactured by Corning, which had been washed with pure water and dried and measured 50×50×0.7 mm, was used as a transparent glass substrate. A conjugated high molecular weight copolymer exemplified in formula (3) was dissolved in mesitylene solvent to obtain a coating liquid having a concentration of 1% by weight. The glass substrate was placed on a spin coater, the coating liquid was dropped thereon, and the substrate was rotated to form a uniform film having a film thickness of 100 μm. At this time, the substrate was rotated for 3 minutes at a rotating speed of 800 rpm. The weight average molecular weight of the conjugated high molecular weight copolymer of the present example as measured using GPC was 70,000 based on polystyrene.

Comparative Example 1

A color conversion film was produced on a transparent glass substrate using the same method as Example 1 with the exception of using a conjugated high molecular weight copolymer (MEH-PPV) represented by the following chemical formula (4) instead of the conjugated high molecular weight copolymer represented by formula (3).

C6:

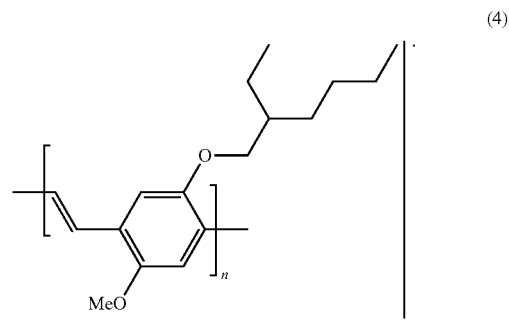

(4)

Comparative Example 2

A conjugated high molecular weight copolymer represented by the following chemical formula (5) (fluorene/MEH-phenylene/vinylene copolymer, American Dye Source Inc., 108GE) was used in addition to a conjugated high molecular weight copolymer represented by formula (3).

C7:

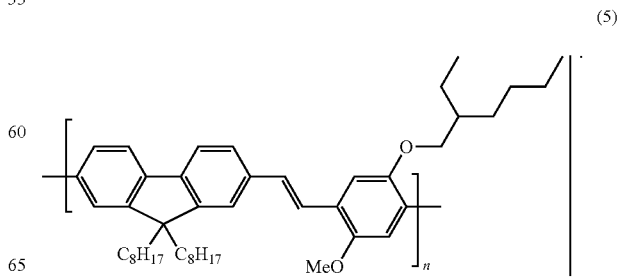

(5)

Evaluation 1

Absolute fluorescent quantum yield (excitation wavelength: 470 nm) was measured using an integrating sphere for the color conversion films produced in Example 1 and Comparative Examples 1 and 2. The results are shown in Table 1.

TABLE 1

|  | Example 1 | Comparative Example 1 | Comparative Example 2 |
|---|---|---|---|
| Thin film fluorescent quantum yield (%) | 90 | 45 | 72 |

As is clear from Table 1, the color conversion film of Example 1 demonstrated extremely high fluorescent quantum yield of 90%. On the other hand, the fluorescent quantum yield of the color conversion film of Comparative Example 2 was 72%, which is roughly 20% lower than the value of Example 1. Moreover, the fluorescent quantum yield of the color conversion film of Comparative Example 1 was even lower at 45%.

Namely, the fluorescent quantum yield of the color conversion film of Comparative Example 2 was higher than that of Comparative Example 1. The cause of this is thought to be based on the effect (first effect) of having imparted rigidity to the polymer chain by introducing fluorene groups, and the effect (second effect) of inhibiting interaction between fluorene groups and arylenevinylene groups as a result of the fluorene groups being separated from the arylenevinylene groups.

In the color conversion film of Example 1, transfer of energy from arylenevinylene groups to fluorene groups is thought to have been inhibited due to the introduction of phenyl groups (third effect). This is also thought to have resulted in a larger fluorescent quantum yield than Comparative Example 2. Moreover, as a result of employing a structure in which phenylene-fluorene-phenylene-vinylene repeating units are inserted between adjacent arylenevinylene groups, interaction between the arylenevinylene groups is more effective inhibited (second effect), and this is thought to be brought about an increase in fluorescent quantum yield.

Evaluation 2

The fluorescent spectra at an excitation wavelength of 470 nm were measured for the color conversion films produced in Example 1 and Comparative Examples 1 and 2. The resulting spectra are shown in FIG. 2.

Figure 2:
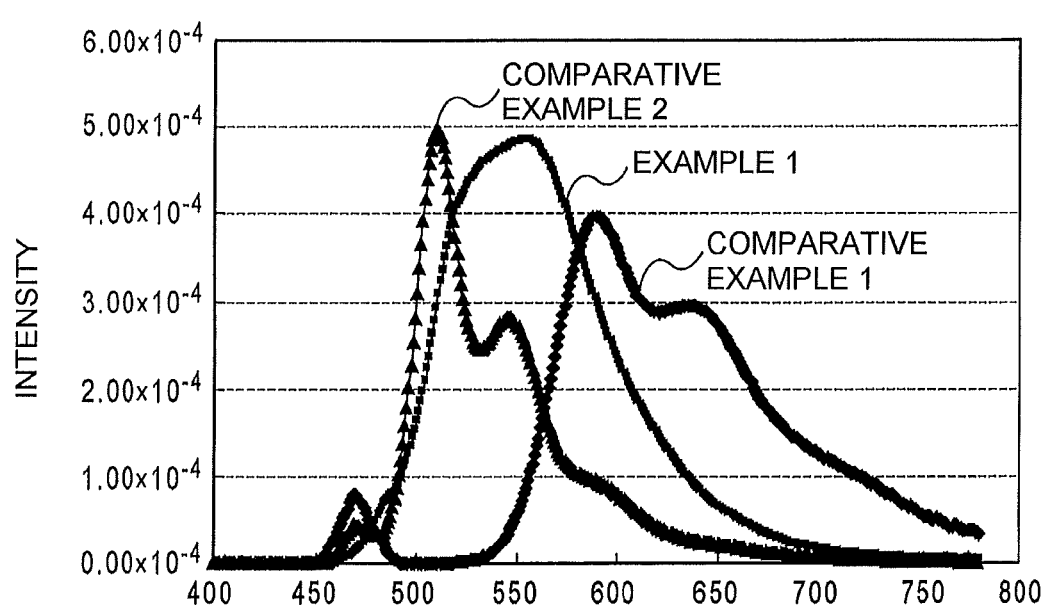
FIG. 2 is a drawing showing the fluorescence spectra at an excitation wavelength of 470 nm of an example and comparative examples 1 and 2.

It can be understood from FIG. 2 that, in contrast to the peak emission wavelength of the color conversion film of Comparative Example 1 being located at 590 nm, that of Comparative Example 2 is located at 510 nm, thus indicating that introduction of fluorene groups shortens emission wavelength. This suggests that presence of interaction between fluorene groups and arylenevinylene groups. In contrast, the peak emission wavelength of Example 1 shifted to a longer wavelength than that of Comparative Example 2, being located at 560 nm. Namely, the peak emission wavelength of Example 1 approaches that of Comparative Example 1. This can be explained has the peak emission wavelength of Example 1 having approached the emission wavelength of the arylenevinylene group itself as a result of interaction between arylenevinylene groups and fluorene groups having been inhibited by introduction of phenylene groups. In this manner, analysis of emission spectra indicated that interaction between arylenevinylene groups and fluorene groups was inhibited by introduction of phenylene groups.

On the basis of the above, the color conversion film of the example, which is within the scope of the present invention, is characterized by containing a conjugated high molecular weight copolymer having a structure that has alternating fluorene group-containing repeating units and arylenevinylene repeating units, and in which phenylene groups are inserted as spacers on both ends of the fluorene groups, and due to these structural characteristics, is thought to realize high color conversion efficiency by inhibiting concentration quenching.

The invention claimed is:

1. A color conversion film, comprising:
a conjugated high molecular weight copolymer that has a structure represented by formula (1):

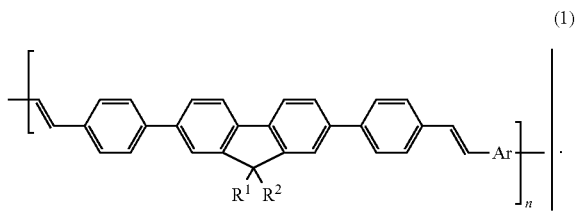

wherein, Ar represents an arylene group or divalent heterocyclic group, $R^1$ and $R^2$ respectively and independently represent a hydrogen atom, alkyl group, alkoxy group, alkylthio group, alkylsilyl group, alkylamino group, aryl group, aryloxy group, arylalkyl group, arylalkoxy group, arylalkenyl group, arylalkynyl group, monovalent heterocyclic group, amino group, nitro group, halogen group or cyano group, and n represents an integer of 1 to 10000, and wherein the conjugated high molecular weight copolymer has a green emission peak wavelength of 490 to 580 nm when in the form of a thin film, having high fluorescent quantum yield of 80 to 90%.

2. The color conversion film according to claim 1, wherein the conjugated high molecular weight copolymer has a structure represented by formula (2):

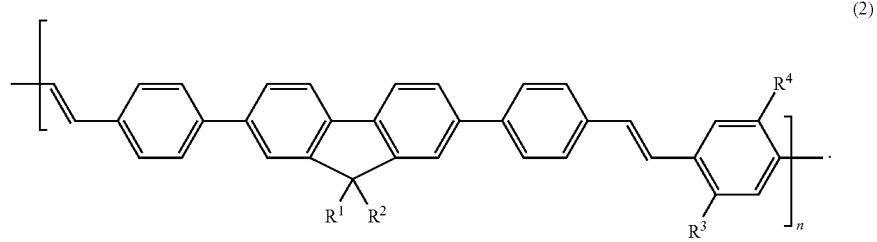

wherein, $R^1$, $R^2$, $R^3$ and $R^4$ respectively and independently represent a hydrogen atom, alkyl group, alkoxy group, alkylthio group, alkylsilyl group, alkylamino group, aryl group, aryloxy group, arylalkyl group, arylalkoxy group, arylalkenyl group, arylalkynyl group, monovalent heterocyclic group, amino group, nitro group, halogen group or cyano group, and n represents an integer of 1 to 10000.

3. The color conversion film according to claim 1, wherein the conjugated high molecular weight copolymer has a weight average molecular weight of 1000 to 500,000.

4. The color conversion film according to claim 1, wherein the color conversion film is formed by a coating process.

5. A multicolor light-emitting organic EL device, comprising:
   a pair of electrodes, at least one of which is a transparent electrode;
   an organic EL layer interposed between the pair of electrodes; and
   the color conversion film according to claim 1 that, has a film thickness of 2 μm or less.

6. The multicolor light-emitting organic EL device according to claim 5, wherein the color conversion film and the transparent electrode are arranged in mutual contact.

* * * * *